(12) United States Patent
Curtin

(10) Patent No.: US 6,380,477 B1
(45) Date of Patent: *Apr. 30, 2002

(54) METHOD OF MAKING PHOTOVOLTAIC DEVICE

(76) Inventor: Lawrence F. Curtin, 215 Cranwood Dr., Key Biscayne, FL (US) 33149

( * ) Notice: Subject to any disclaimer, the term of this patent is extended or adjusted under 35 U.S.C. 154(b) by 0 days.

This patent is subject to a terminal disclaimer.

(21) Appl. No.: 09/509,262

(22) PCT Filed: Jan. 24, 2000

(86) PCT No.: PCT/US00/01637

§ 371 Date: Mar. 24, 2000

§ 102(e) Date: Mar. 24, 2000

(87) PCT Pub. No.: WO00/59035

PCT Pub. Date: Oct. 4, 2000

Related U.S. Application Data

(63) Continuation-in-part of application No. 09/351,136, filed on Jul. 12, 1999, now Pat. No. 6,160,215.
(60) Provisional application No. 60/126,325, filed on Mar. 26, 1999.

(51) Int. Cl.$^7$ ........................ H01L 25/00; H01L 31/045; H01L 31/048
(52) U.S. Cl. ........................ 136/244; 136/256; 136/251; 136/245; 257/433; 257/431; 438/98; 438/64; 438/66
(58) Field of Search .................. 136/244, 256, 136/251, 245; 257/433, 431; 438/98, 64, 66

(56) References Cited

U.S. PATENT DOCUMENTS

| | | |
|---|---|---|
| 3,729,343 A | 4/1973 | Thomas |
| 4,363,929 A | 12/1982 | Bollen |
| 4,686,321 A | 8/1987 | Kishi |
| 4,860,509 A | 8/1989 | Laaly et al. |
| 5,176,758 A | 1/1993 | Nath et al. |
| 5,298,085 A | 3/1994 | Harvey et al. |
| 5,417,770 A | 5/1995 | Saitoh et al. |
| 5,457,057 A | 10/1995 | Nath et al. |
| 5,508,205 A | 4/1996 | Dominguez et al. |
| 5,520,763 A | 5/1996 | Johnstone |
| 5,674,325 A | 10/1997 | Albright et al. |
| 5,868,869 A | 2/1999 | Albright et al. |
| 5,968,287 A | 10/1999 | Nath |
| 6,015,951 A | 1/2000 | Ikai et al. |
| 6,160,215 A | * 12/2000 | Curtin .................. 136/244 |

* cited by examiner

*Primary Examiner*—Alan Diamond
(74) *Attorney, Agent, or Firm*—Richard C. Litman

(57) ABSTRACT

A photovoltaic device and a method for its manufacture. The device essentially comprises a thin film cell layer 14, a contact transfer release sheet 54, and a foil strip interconnect clip 80. The contact transfer release sheet 54 is bonded to the thin film cell layer 14 in vacuum deposition chambers 12 to produce a roll 62 of photovoltaic material. The photovoltaic material is then cut into segments that are referred to as thin film cell stickers 64. The thin film cell stickers have a barrier layer which is removable to expose a ready-to-apply sticker. The stickers 64 are then adhered to a substrate, like glass, and arranged, side by side, in a row 66. Row 66 of stickers 64 is formed into a series or parallel circuit using a conductive foil strip interconnect clip 80. The interconnect clip is used to complete the circuit between adjacent thin film stickers, preferably by crimping the interconnect to adjacent bus bar segments 87 & 91, of adjacent stickers 64.

17 Claims, 12 Drawing Sheets

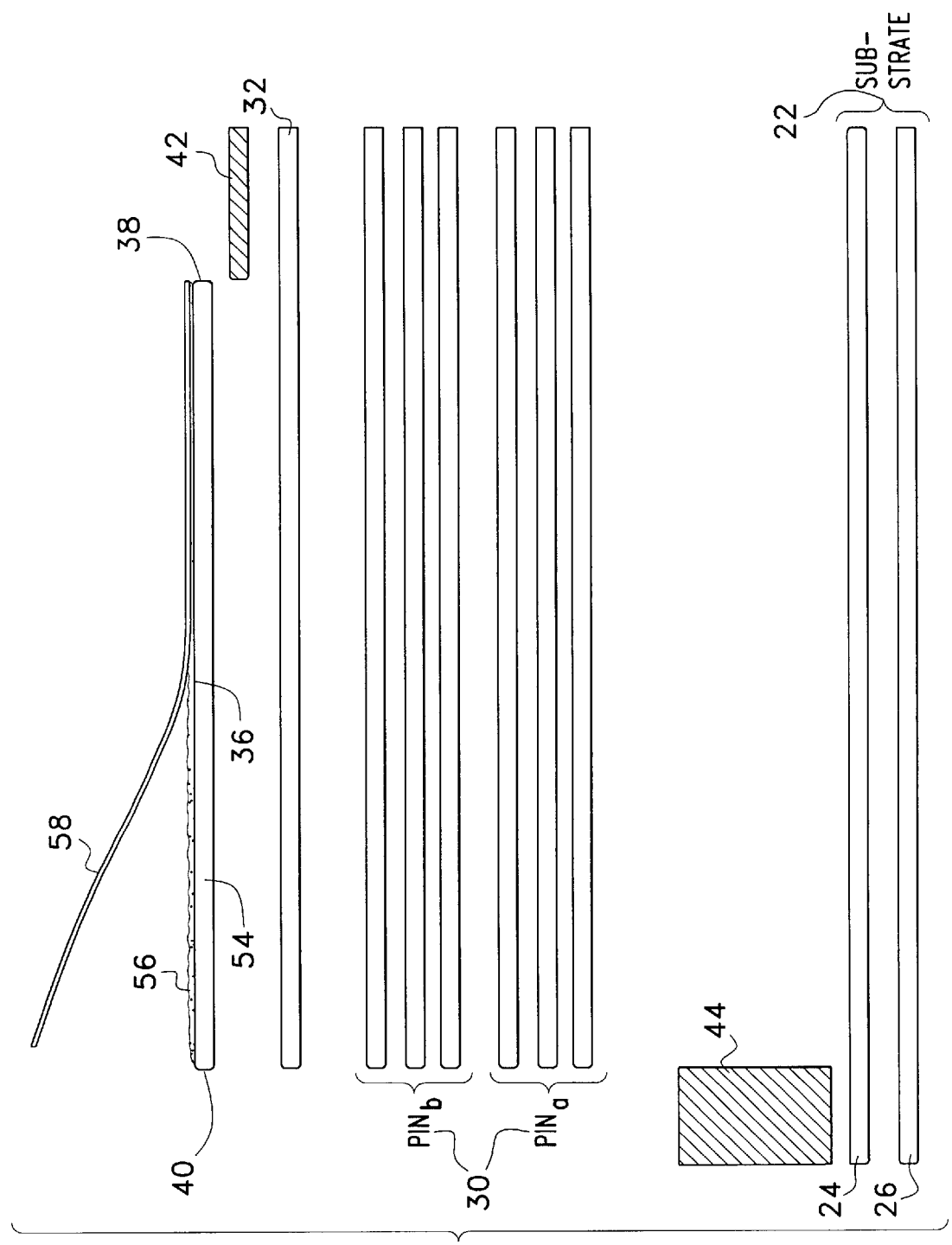

METHOD OF MAKING PHOTOVOLTAIC DEVICE

CROSS-REFERENCE TO RELATED APPLICATIONS

This application is a 371 of PCT/US00/01637 filed Jan. 27, 2000, which claims the benefit of provisional application Ser. No. 60/816,325 filed Mar. 25, 1999.

This application is a continuation-in-part of application Ser. No. 09/351,136 filed Jul. 12, 1999, now U.S. Pat. No. 6,160,215.

TECHNICAL FIELD

The present invention relates to a photovoltaic cell product and a method for its manufacture.

BACKGROUND ART

Photovoltaic devices or solar cells absorb sunlight and convert it directly into electrical energy. The basic scientific principles which underlay the effect of converting light energy into internal voltages using photovoltaic cells are well understood.

Most types of photovoltaic cells have a photoactive area, i.e., an area that generates electricity in response to light and is composed of a semiconductor layer disposed between two electrode layers deposited on a flat, supporting substrate. The photoactive area is divided into a number of photovoltaic cells interconnected in series to boost the voltage output. The photovoltaic cells may then be encapsulated, e.g. with plastic, to protect the cells from the external environment during transportation and operation of the cells. A number of electrically interconnected photovoltaic cells may be supported on a common rigid medium, such as glass, to form a photovoltaic module.

The process of sequentially forming photovoltaic layers onto a supporting substrate is a common technique for making "thin film photovoltaic cells," also a well known product. Most thin film solar cells are deposited onto glass as part of the manufacturing process. However, the sequential deposition of layers on a rigid medium such as glass is expensive, cumbersome, not well suited to high speed operation, and often expensive to ship. Moreover, the plastic casing is expensive and it remains a failure point throughout the life of the photovoltaic cells due to the tendency of plastic to degrade in sunlight. Thus, there is a need for an improved process of making thin film cells which is more suitable for high volume production, increased life span, versatility of the product, and lower manufacturing and transport costs.

U.S. Pat. No. 5,674,325 issued to Albright et al. on Oct. 7, 1997 is an example of a method of manufacturing a thin film photovoltaic device. Albright et. al. describes a process involving a "surrogate substrate" that is separated from film layers so that the film layers may eventually be incorporated into a photovoltaic cell to be supported on a permanent substrate. The Albright device does not have a permanent substrate onto which the photovoltaic material is deposited, rather it has a surrogate substrate. More importantly, the Albright device does not contain or suggest the use of a contact transfer release sheet as a top layer, over the thin film cells, or elsewhere. The same holds true for U.S. Pat. No. 5,868,869 issued to Albright et al. on Feb. 9, 1999. Other methods and devices similar to, or analogous with, thin film cells and their manufacture include U.S. Pat. No. 5,520,763 issued to Johnstone on May 28, 1996, which describes a manufacturing process in the printing art that uses a foil strip and a release sheet fed through a roller. Johnstone does not suggest the present method of making a photovoltaic device. U.S. Pat. No. 5,417,770 issued to Saitoh et al. on May 23, 1995 is a forming method used in the manufacture of a photovoltaic device. Saitoh et al. do not suggest the present method of making a photovoltaic device. U.S. Pat. No. 3,729,343 issued to R. D. Thomas on Apr. 24, 1973 describes a method of rolling a thermocouple tape. R. D. Thomas does not suggest the present method of making a photovoltaic device.

None of the above inventions and patents, taken either singly or in combination, is seen to describe the instant invention as claimed.

DISCLOSURE OF INVENTION

The present invention is a photovoltaic device and method for its manufacture that facilitates packaging, transport and installation of solar panels and solar arrays. The manufacturing process incorporates a multi-vacuum-chamber system forming a thin film cell layer made from photovoltaic materials on a permanent substrate. The thin film cell layer is then binded to a contact transfer release sheet.

The photovoltaic materials includes: multiple p-i-n junctions, a Zno layer, film masked fingers, and continuous bus bars deposited along each of two edges of the thin film cell layer, one bar along a positively charged edge, and one bar along the negatively charged edge. Adhesion of the contact transfer release sheet to the thin film cell layer is also performed in a vacuum deposition chamber.

A roll of photovoltaic material is then segmented at intervals of at least three fingers, to produce thin film cell stickers, preferably about one inch by twenty-four inches in area. This product can be shipped directly to end users for on-site customization. Included in the method is a procedure for on-site customizing, wherein, the outer barrier layer of the release sheet is removed. The thin film cell stickers are then adhered, like the backing of a bumper sticker, to the underside of a translucent medium to form a solar panel.

The panel may be customized into a parallel circuit or a series circuit. Finally, a conductive foil strip interconnect clip is crimped to the adjacent bus bars of adjacent thin film cell stickers. The sun shines through the translucent medium (e.g., glass), hits the photovoltaic thin film cells, and electrical energy is drawn off by a conduit.

Accordingly, it is a principal object of the invention to facilitate compact packaging, and to reduce transportation costs by enabling photovoltaic devices to be shipped separately from any glass, aluminum frame, or any other typically heavy medium, thus reducing the weight and therefore the cost of shipping.

Still another object of the invention is to provide a process and a product that eliminates the need to encase thin film photovoltaic cells in plastic, which is costly.

It is yet another object of the invention to provide a photovoltaic product that minimizes the possibility of theft, vandalism, or damage from natural elements.

It is an object of the invention to provide improved elements and arrangements thereof in an apparatus for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

FIG. 3A is an exploded elevation view of a strip of thin film cells comprising a permanent substrate, a plurality of PIN layers topped by a ZnO clear conductive layer; a pair of continuous bus bars and fingers; and a contact transfer release sheet.

Similar reference characters denote corresponding features consistently throughout the attached drawings.

BEST MODE FOR CARRYING OUT THE INVENTION

Figure 8A:
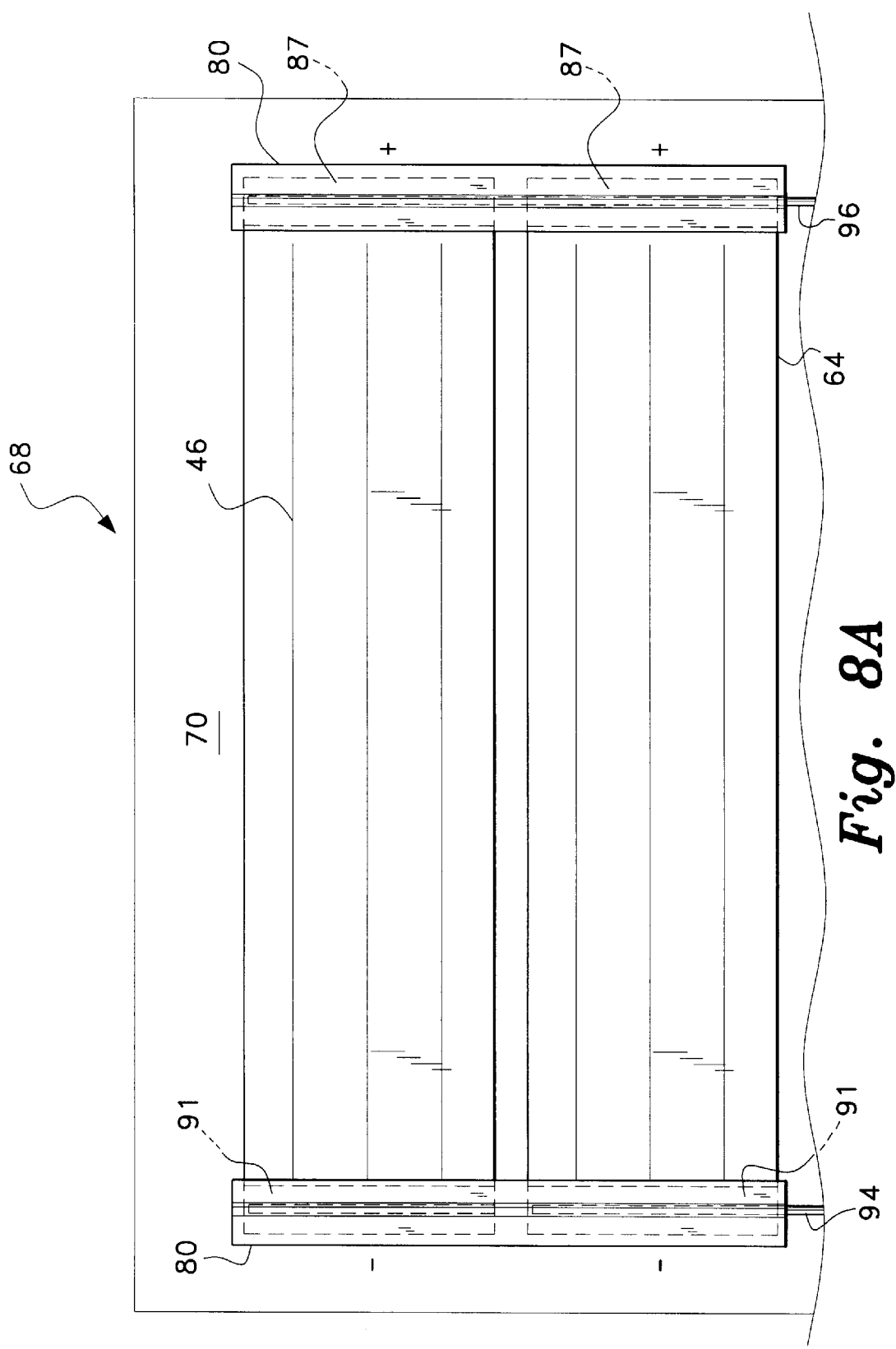
FIG. 8A shows a parallel circuit of thin film cell stickers adhered to a translucent medium after removal of the release sheet according to FIG. 7.
Figure 8B:
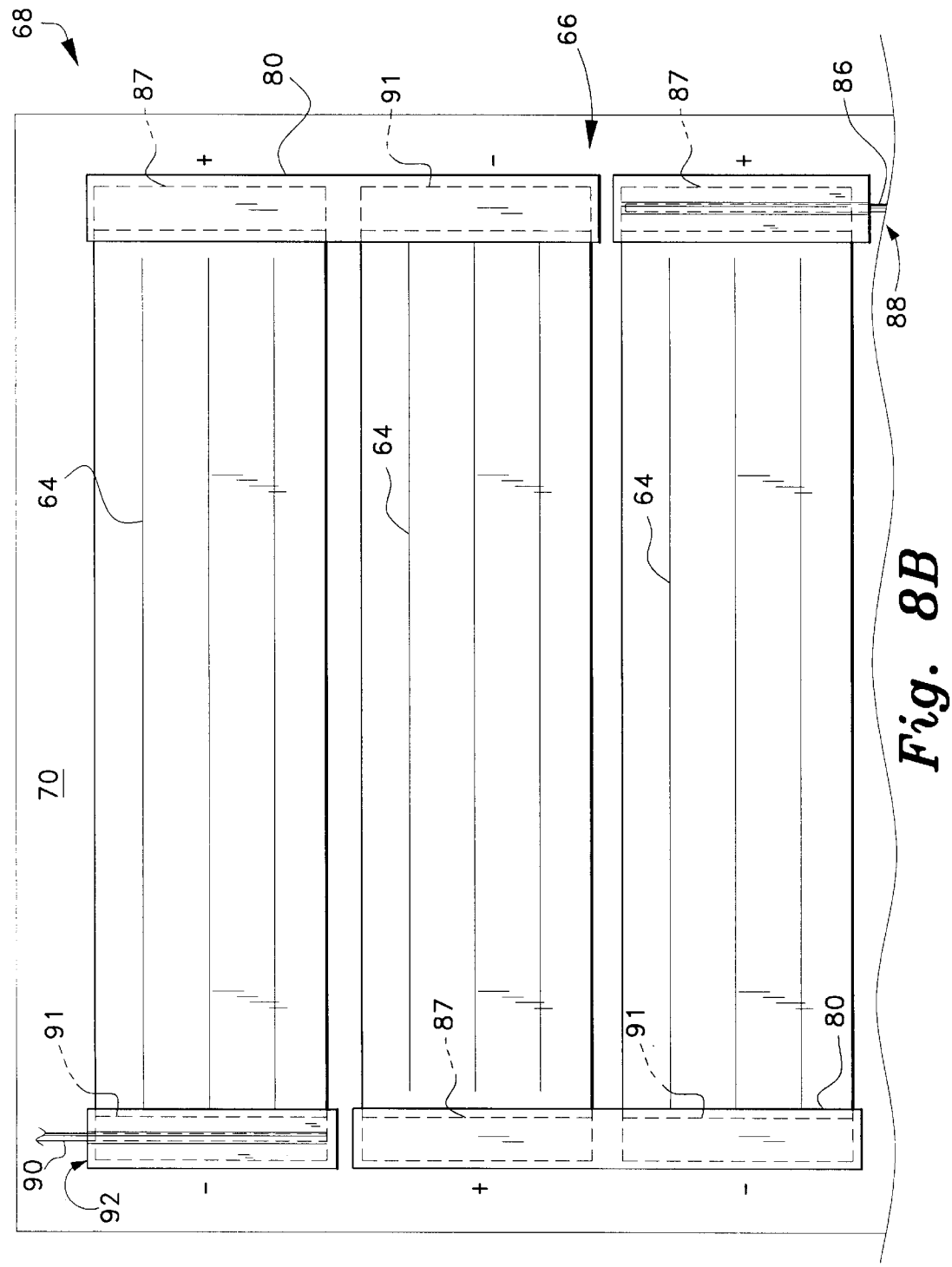
FIG. 8B shows a series circuit of thin film cell stickers adhered to a translucent medium after removal of the release sheet according to FIG. 7.
Figure 9A:
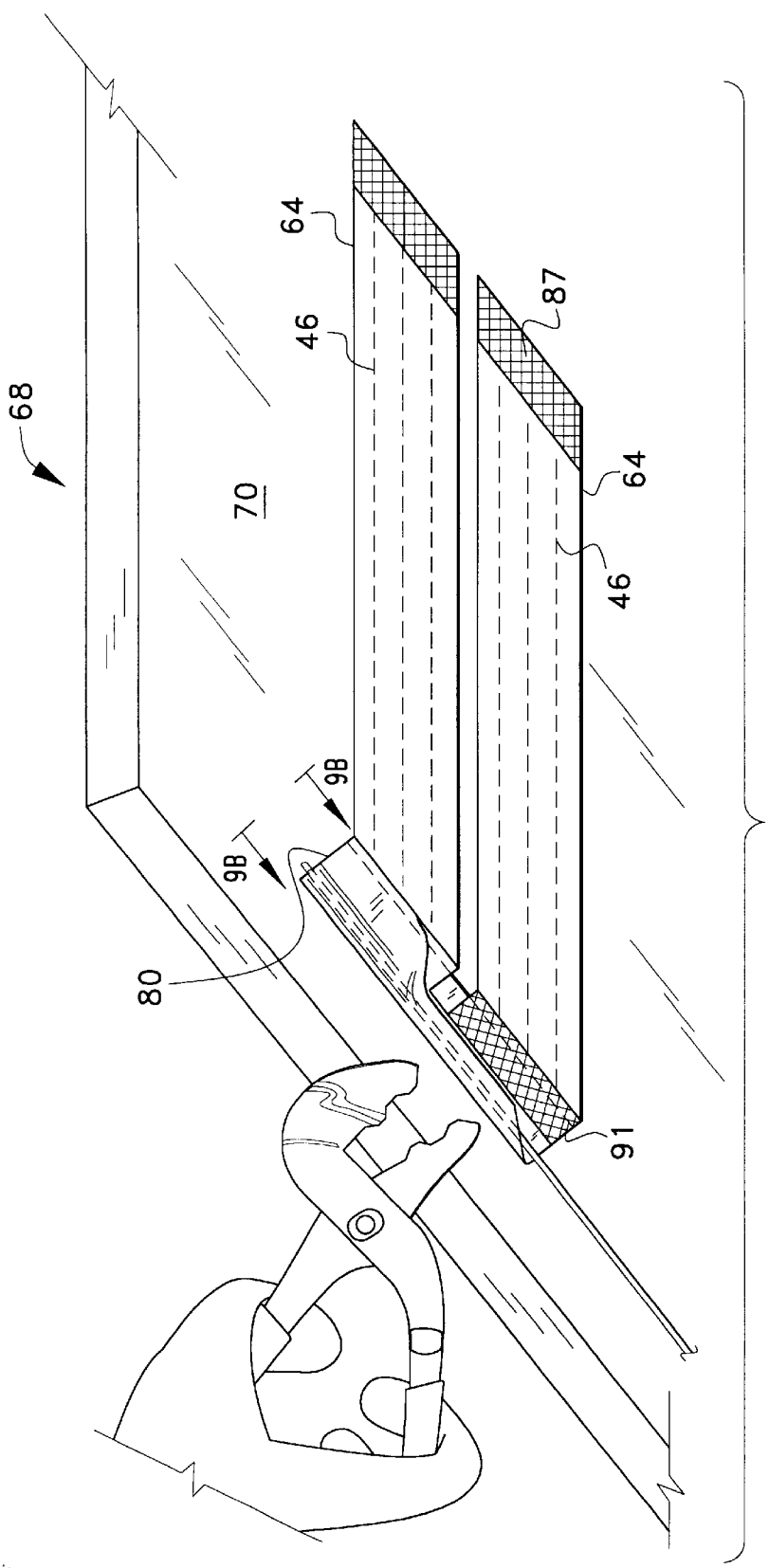
FIG. 9A is an environmental perspective view of two solar cell strips being adhered to a glass surface and customized by having a foil strip interconnect and conduit crimped to their adjacent, non-adhered bus bars.

The present invention is a photovoltaic device and a method for its manufacture. The components of the device essentially comprise a contact transfer release sheet 54 binded to a thin film cell layer 14 in a series of vacuum deposition chambers 12 that are symbolically represented in FIG. 1. As shown in FIGS. 8A, 8B and 9A, a foil strip interconnect clip 80 may then be used on-site to produce a solar panel 68.

According to the preferred embodiment, thin film cell layer 14 comprises a photovoltaic material deposited onto a permanent substrate 22. Substrate 22 is produced in a first vacuum deposition chamber 20. Preferably, substrate 22 is comprised of a conductive metal layer 24, preferably aluminum, on a polyimide base layer 26.

Figure 3B:
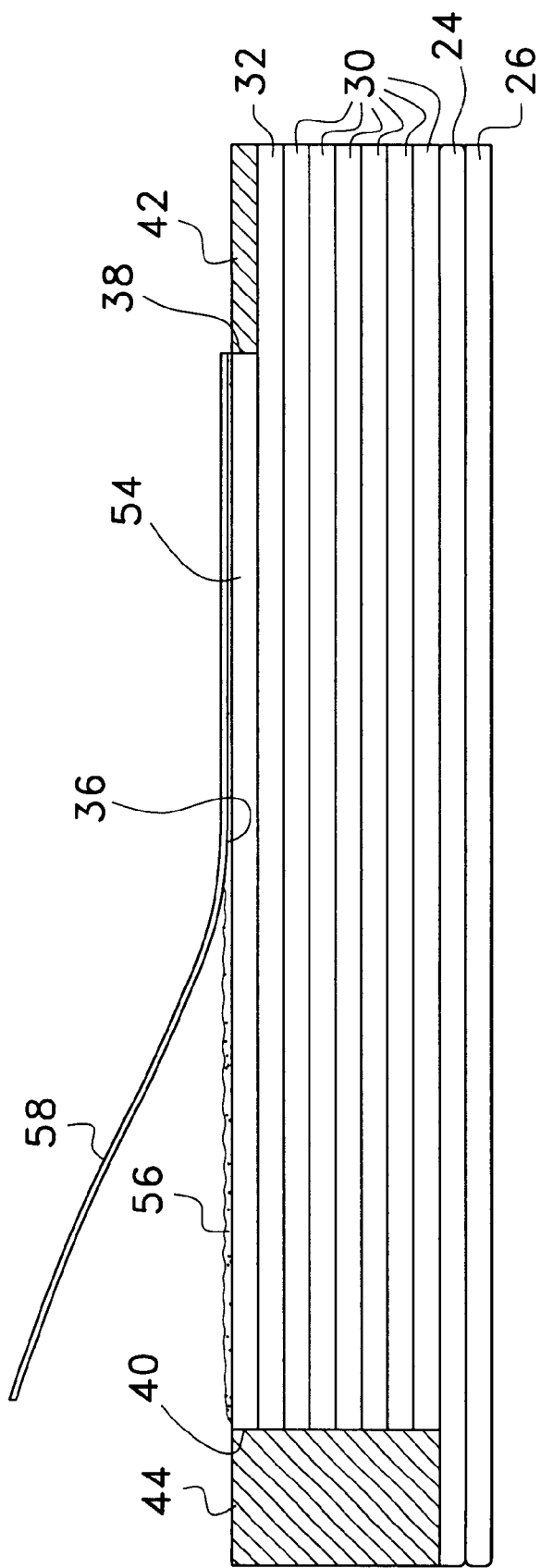
FIG. 3B is a condensed representation of the elevation view shown in FIG. 3A.
Figure 4:
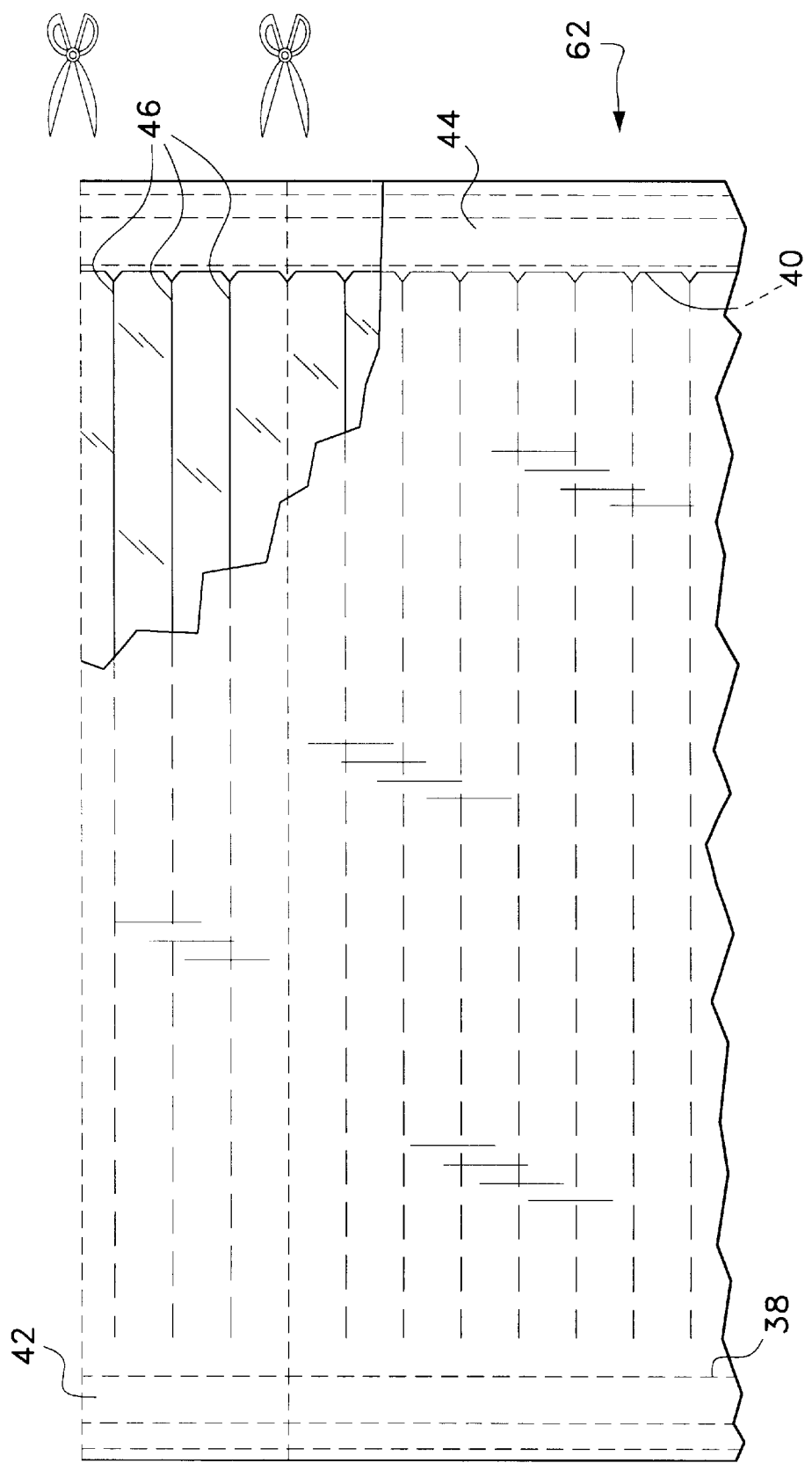
FIG. 4 illustrates the cutting or segmentation of the roll in FIG. 3C into thin film cell stickers.

As best shown in FIGS. 3A, 3B and 4, the photovoltaic material comprises at least the following layers: a multiple preferably tandem (p-i-n) junction 30, a clear conductive layer 32, a positive edge 38 parallel to negative edge 40, a contact surface 36 extending between edge 38 and edge 40, a positive bus bar 42, a negative bus bar 44, and fingers 46.

Figure 1:
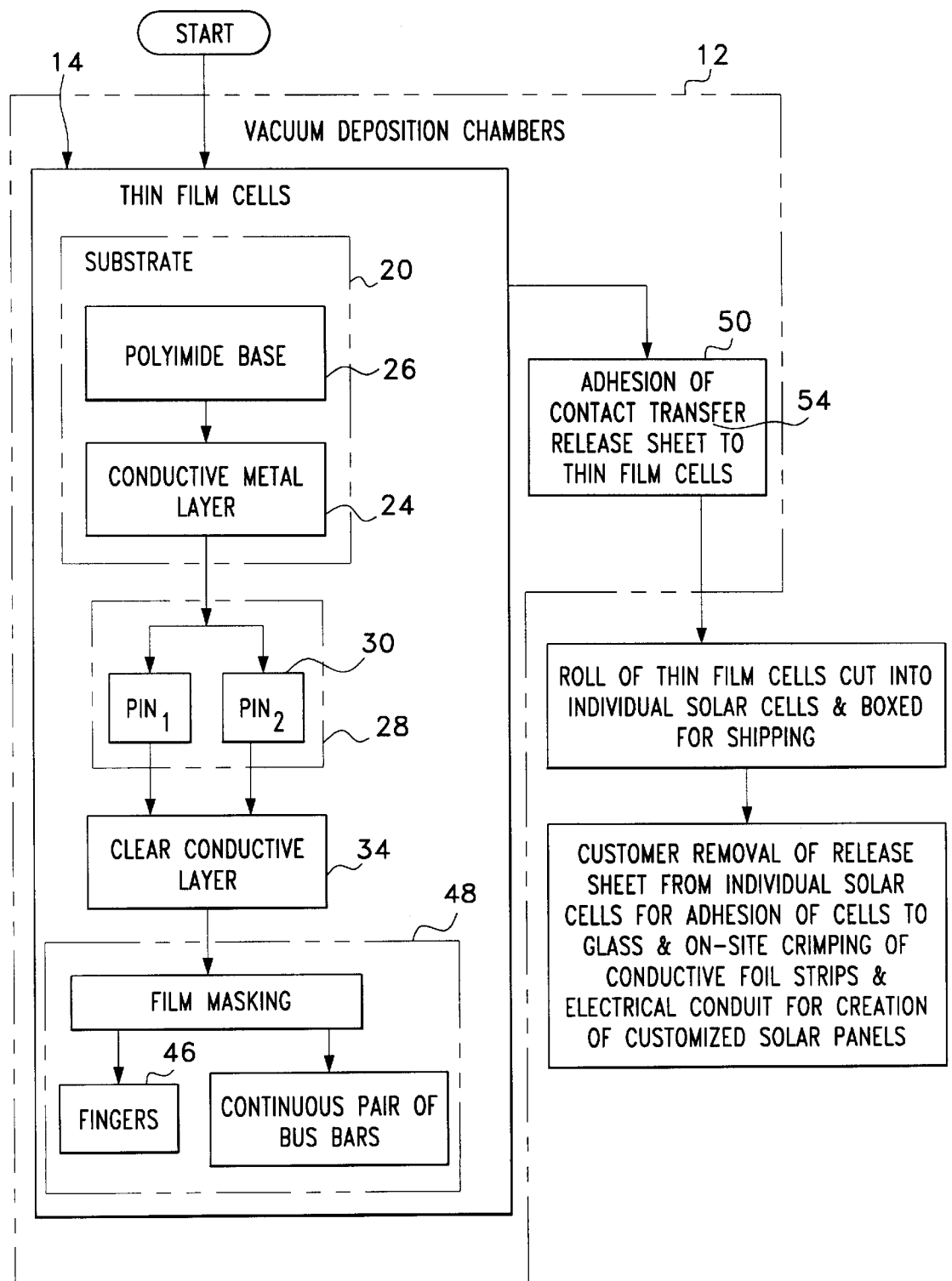
FIG. 1 is a block diagram of a manufacturing process for making a photovoltaic device in a vacuum deposition chamber, including the steps of cutting the device into strips of unit cells for shipping and on-site customization.

Referring to FIG. 1, in a second vacuum deposition chamber 28, a (p-i-n) device 30, or other (p-i-n)-equivalent material, is deposited onto metal layer 24 of substrate 22. Preferably, device 30 should be a tandem a-Si p-i-n junction, as represented in FIG. 1, and as is well known in the art.

In a third vacuum chamber 34, a clear conductive layer 32, designed to draw energy from a negative edge of the thin film cells, is deposited upon the a-Si p-i-n, or equivalent material. The process occurring in chamber 34 is known in the art. The clear conductive layer 32 is preferably a ZnO top contact material that is also well known in the art. Layer 32 may alternatively be made from ITO or its equivalent.

In a fourth vacuum deposition chamber 48, bar 42 and bar 44 are deposited, using a film masking technique, onto layer 32 along edge 38 and 40, respectively. During the same process, and using the same film masking technique, fingers 46 are masked onto clear conductive layer 32. Fingers 46 extend from negative bus bar 44 (at negative edge 40) to proximate positive bus bar 42 (near positive edge 38).

In yet a fifth vacuum deposition chamber 50, also shown in FIG. 1, a contact transfer release sheet 54 is bonded to clear conductive layer 32 of thin film cell layer 14. Release sheet 54 contains a clear adhesive 56, a release agent such as a wax product, and a top, removable barrier layer 58, preferably made from a paper product, a plastic composite, or its equivalent. The adhesive 56 is preferably silicone-based and necessarily adherable to contact surface 36. Release sheet 54 spans the gap between positive bus bar 42 and negative bus bar 44 such that the bus bars remain free of adhesive material.

Figure 2:
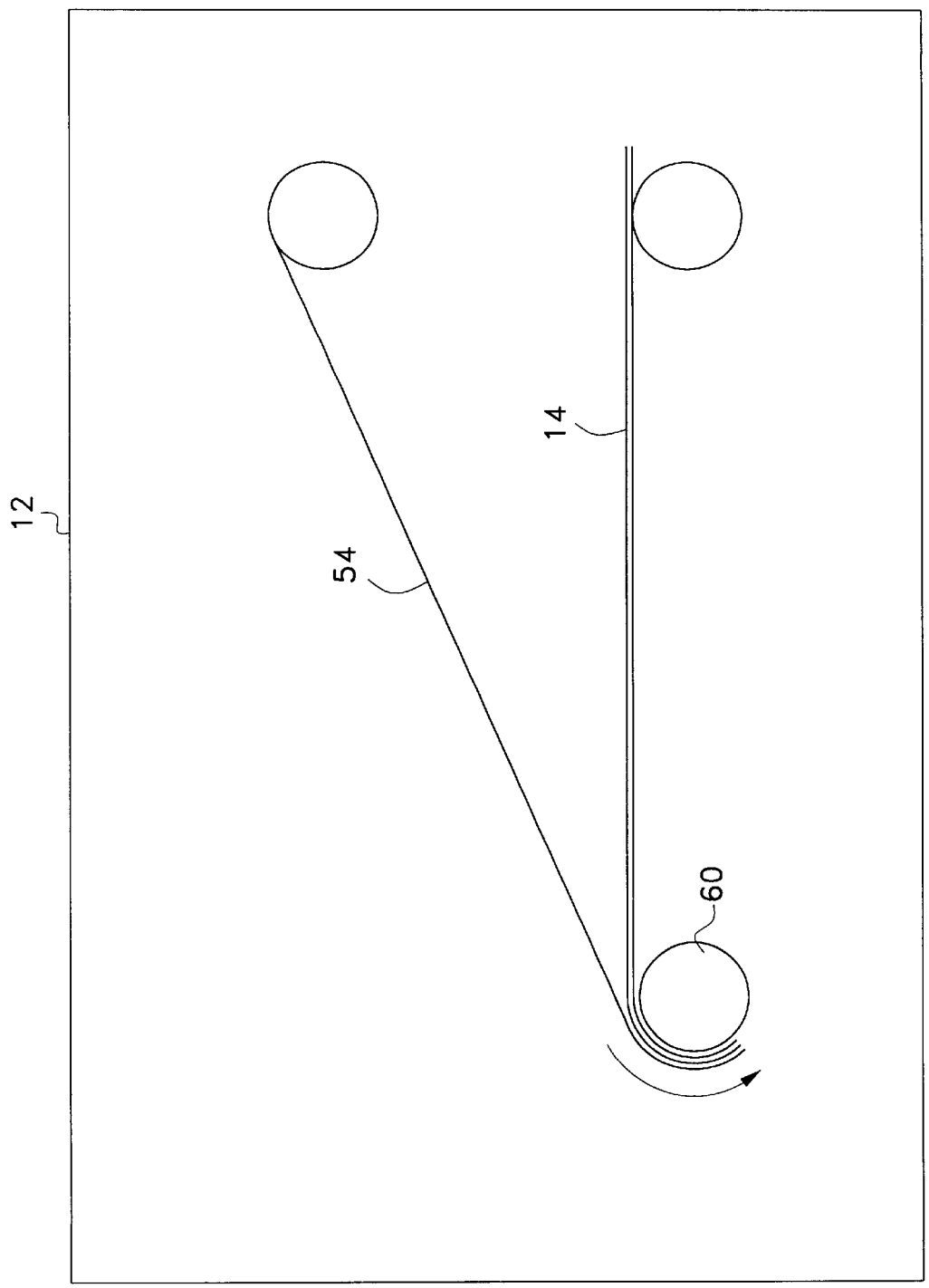
FIG. 2 is a symbolic representation of the manufacturing of a photovoltaic device incorporating the joining of a contact transfer release sheet to a thin film cell layer, in an inert vacuum chamber.
Figure 3C:
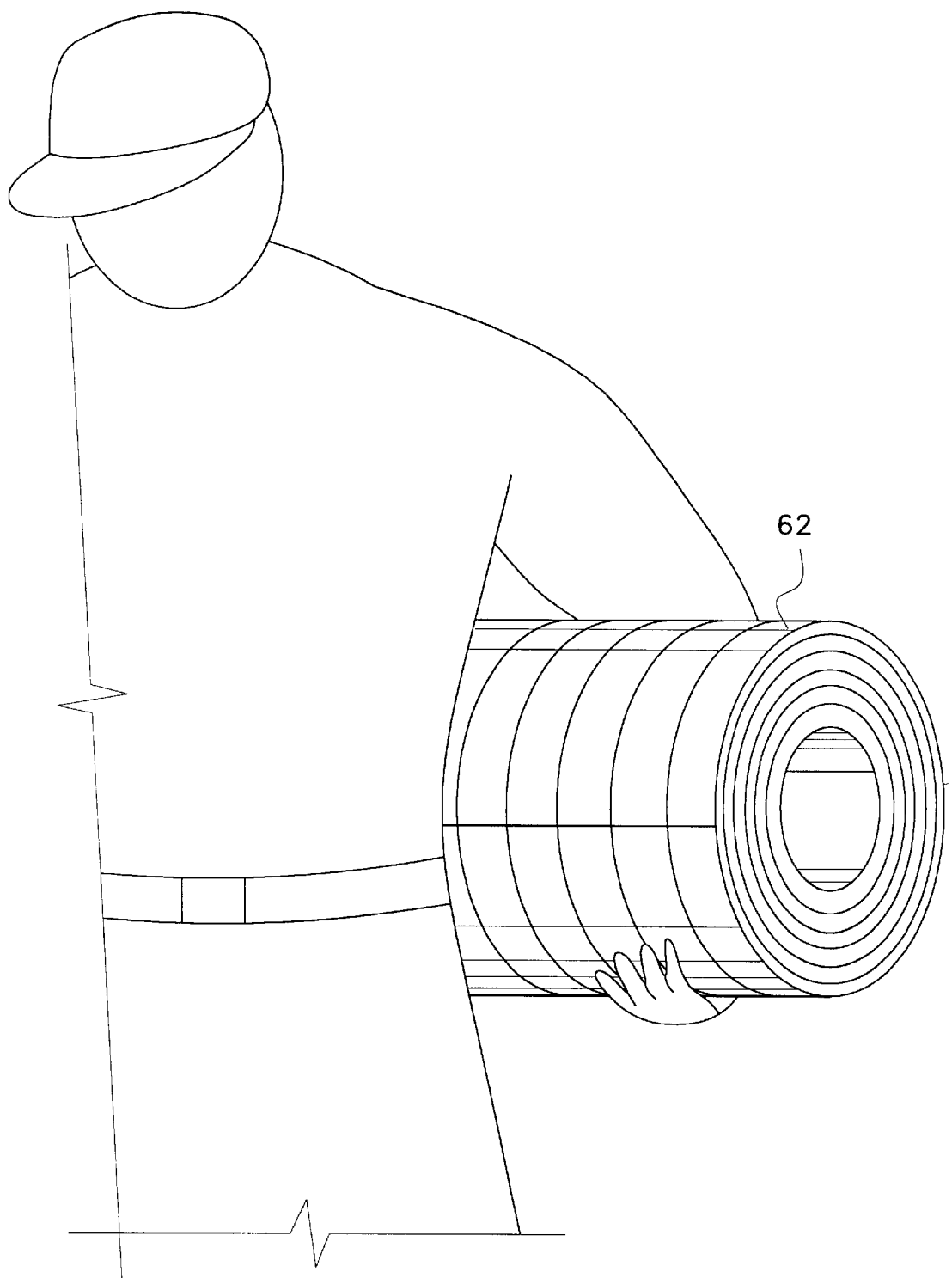
FIG. 3C shows a man carrying a roll of photovoltaic material resulting from those steps carried out in the vacuum deposition chamber disclosed in FIG. 1.

As shown in FIG. 3C, the preferred photovoltaic device is manufactured in rolls 62. FIG. 2 shows thin film cell layer 14 and release sheet 54 being wound onto drum 60 inside vacuum chambers 12. In an alternate embodiment, the device may be manufactured in large sheets. In any case, the rolls may range anywhere from 12 to 36 inches in width, but are preferably 24 inches in width. The rolls can be up to 20,000 feet in length, but at least some rolls will be 3,500 feet.

Figure 5:
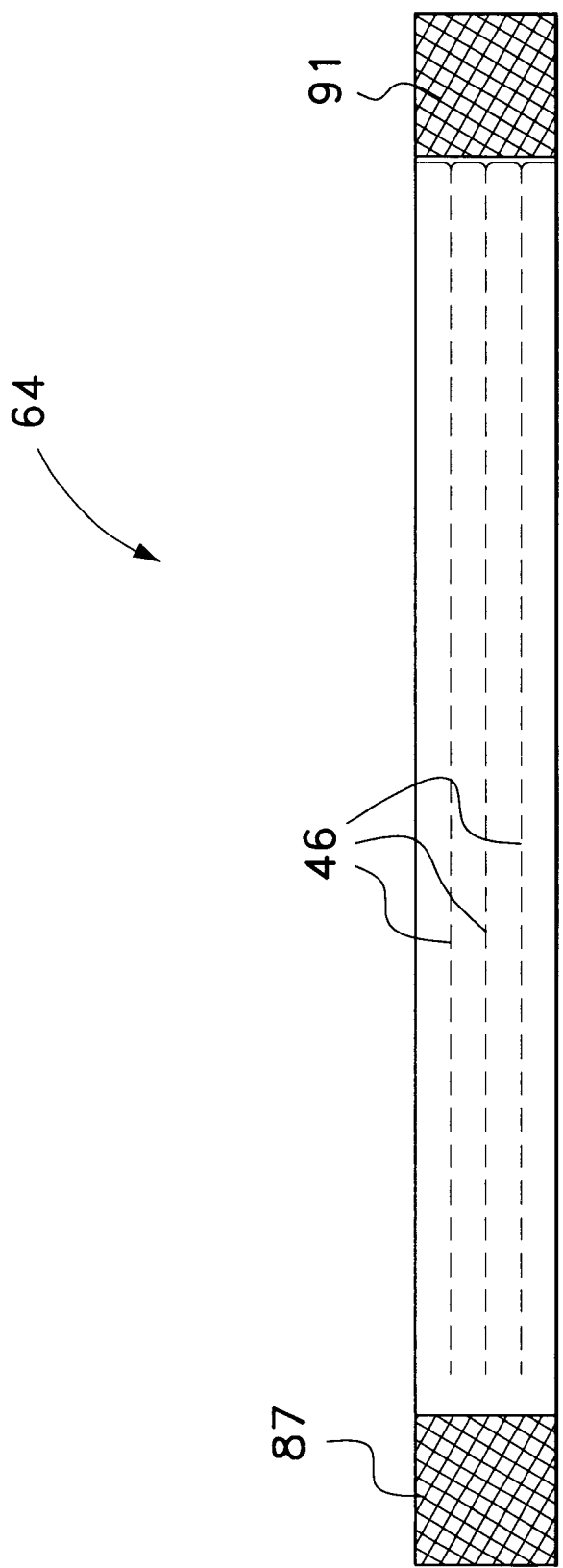
FIG. 5 is a plan view of the 1 inch by 24 inch thin film cell stickers resulting from the procedure shown in FIG. 4, with contact transfer release sheet still intact.
Figure 6:
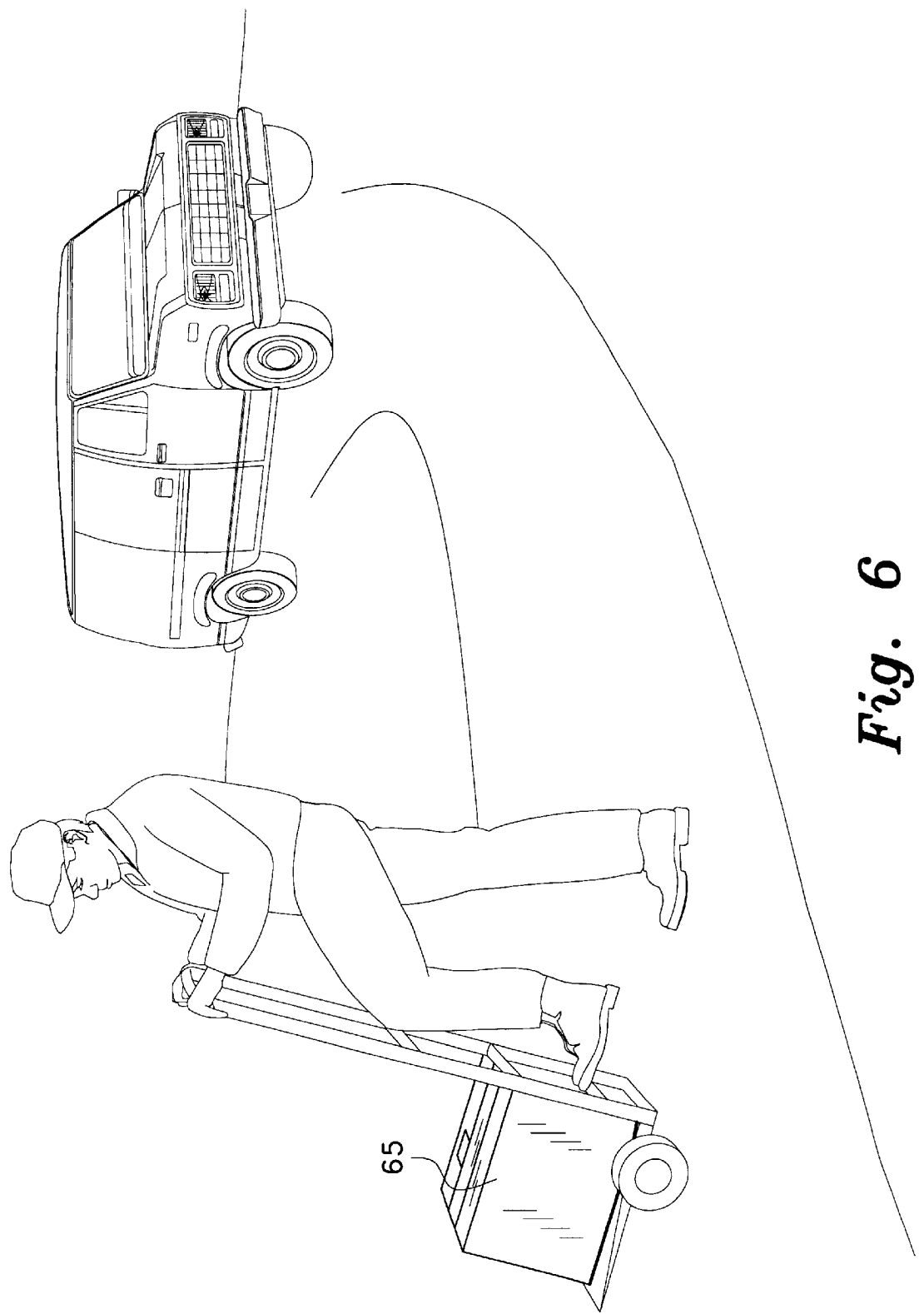
FIG. 6 shows a person carrying to a U.S. Post Office delivery truck a box of the thin film cell stickers resulting from the process disclosed in FIG. 5.

As illustrated in FIG. 4, after a roll 62 is removed from vacuum chambers 12, it is cut, severed, or otherwise is segmented width-wise into strips, preferably at one inch intervals, along lines perpendicular to the longitudinal axis of bus bars 42, 44. These intervals are designed to incorporate at least every three fingers 46, so as to produce an elongated, preferably 1 inch by 24 inch thin film cell stickers 64 as shown in FIG. 5. Each of stickers 64 has a positive bus bar segment 87, and a negative bus bar segment 91, one at each of its two opposite ends. As shown in FIG. 6, sticker 64 is placed in a box 65 up and readied for its end use as part of a solar panel 68.

Figure 7:
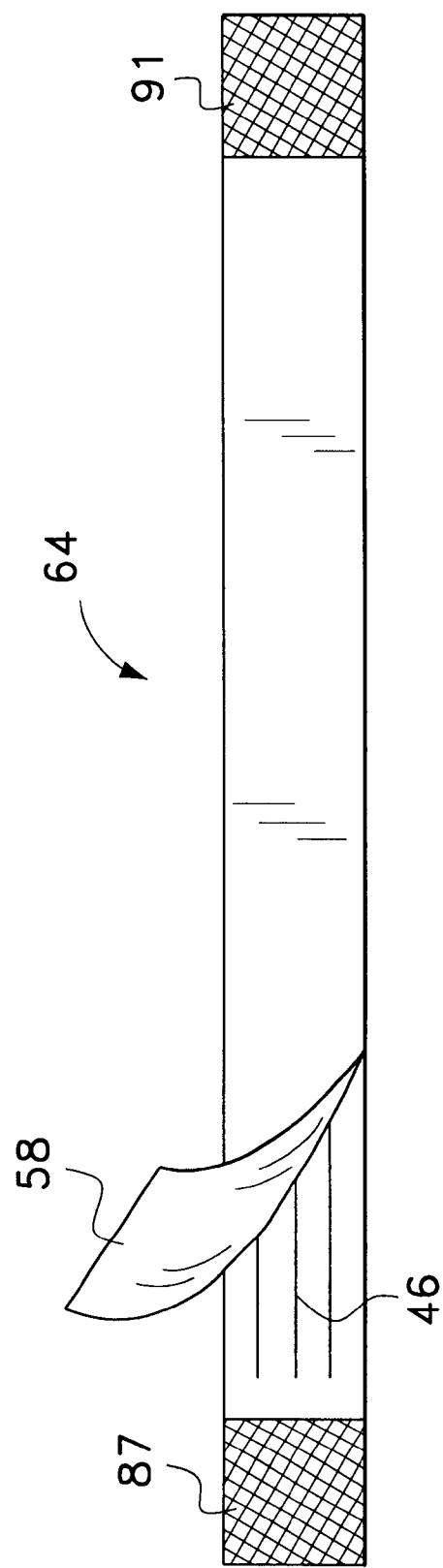
FIG. 7 is a plan view of a 1 inch by 24 inch thin film cell sticker, showing the barrier layer of the contact transfer release sheet being removed.

At a work site, the outer barrier layer 58 of the release sheet is removed, as shown in FIG. 7, and then adhered, like the backing of a bumper sticker, to the underside of a translucent, rigid support plate 70, preferably glass, to form a solar panel 68. Thus, the preferred panel 68 of the present invention comprises a translucent, rigid support plate 70 to which is adhered one or more rows of thin film cell stickers 64.

Plate 70, shown in FIGS. 8A, 8B and 9A, has a front side directly exposed to a radiant energy source, and a back side opposite said radiant energy source. Stickers 64, after barrier layer 58 is removed, are adhered, side by side, to the back side of plate 70. Each of stickers 64 has a pair of oppositely charged bus bar segments 87, 91.

Figure 9B:
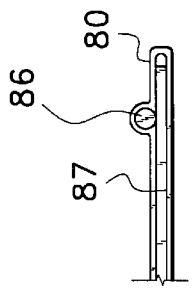
FIG. 9B is an end view of the crimping of an interconnect clip to bus bars and conduit of FIG. 9A.

As best shown in FIG. 9A, since the bus bar segments are free of adhesive, adjacent bus bar segments from adjacent stickers may be lifted up as though they were a single flap and bound together with a foil strip interconnect clip 80. Clip 80 is crimped onto the segments, as best shown in FIGS. 9A and 9B. A clip 80 may be used to connect each pair of bus bar segments 87, 91, on each of the stickers, to one of the segments from an adjacent sticker 64. Interconnect clip 80 is preferably made from a tin coated copper, aluminum, or other malleable metal having electrically conductive properties suitable for collecting voltage along consecutive bus bar segments of thin film cell stickers 64. For thin film cell stickers that are the preferred 1 inch by 24 inch size, interconnect 80 is preferably just short of 2 inches in length, and having less depth than a bus bar so as not to interfere with the thin film cell layer. As shown in FIG. 9B, the interconnect has a slight indentation on a surface so that a lead wire can be captured between an inside wall of clip 80 and one of the bus bar segments, without interfering with a snug compressive contact between the inside walls of clip 80 and adjacent bus bar segments 87, 91.

A solar panel, according to the preferred embodiment, may be constructed into series or parallel circuits. A series circuit is created by arranging a row 66 of stickers 64 such that adjacent bus bar segments, of adjacent stickers, are oppositely charged. Referring to the series circuit in FIG. 8B, a first wire 86 is connected to a positive bus bar segment 87, at a first end 88 of the row 66 of stickers 64. A second wire 90 is connected to a negative bus bar segment 91 at a second end 92 of the row of stickers. In the series circuit, the cells increase the voltage while the amperage remains at the level of the output of the lowest cell.

A parallel circuit of the solar panel is shown in FIG. 8A, where abutting bus bar segments are similarly charged. In this circuit, a third wire 94 and a fourth wire 96 traverse bus bar segments 87 and 91. In parallel, the cells increase the amperage, yet the voltage remains at that of the lowest voltage cell. In the case of each of the series and the parallel circuit, the two wires draw electrical output from the solar panel to an electrical junction.

I claim:

1. A photovoltaic device, comprising:
    a thin film cell layer made from photovoltaic material deposited onto a flexible planar substrate, said material having a positive edge parallel to a negative edge and a contact surface therebetween; and
    a contact transfer release sheet adhered to said contact surface.

2. The photovoltaic device according to claim 1, wherein said device is in the form of a roll, said roll formed by rolling said thin film cell layer and said contact transfer release sheet onto a drum.

3. The device according to claim 1, wherein said photovoltaic material further comprises:
    at least two p-i-n junctions;
    a clear conductive layer overlaying said junctions;
    a positive bus bar disposed along the positive edge and a negative bus bar disposed along the negative edge; and
    a plurality of photovoltaic fingers, each of said fingers extending from said negative bus bar to proximate said positive bus bar.

4. The device according to claim 1, wherein said substrate comprises a conductive metal layer disposed upon a polyimide base.

5. The photovoltaic device according to claim 3, wherein said device is in the form of thin film cell stickers, said stickers formed by segmenting said device along lines perpendicular to the longitudinal axis of each said bus bar, and at intervals of at least every three said fingers, and wherein each of said stickers has a positive bus bar segment and a negative bus bar segment.

6. The device according to claim 3, wherein said release sheet spans the gap between the negative bus bar and the positive bus bar, but does not overlap either said bus bar, such that each said bus bar remains free of adhesive materials.

7. The device according to claim 1, wherein said contact transfer release sheet comprises a clear adhesive, a release agent, and a barrier layer.

8. The device according to claim 2, wherein said contact transfer release sheet comprises a clear adhesive, a release agent, and a barrier layer.

9. The device according to claim 7, wherein said adhesive is silicone-based.

10. The device according to claim 8, whereins said adhesive is silicone-based.

11. A solar panel, comprising:
    a translucent, rigid support plate having a front side directly exposed to a radiant energy source, and a back side opposite said radiant energy source;
    a row of adjacent thin film cell stickers adhered to said back side of said plate, each of said stickers having a pair of oppositely charged bus bar segments, wherein each of said pair abuts and is collinear with another of said segments;
    a foil strip interconnect clip connecting each of said pair of each of said stickers to one of said pair of an adjacent of said stickers;
    a first wire connected to one of said segments at a first end of said row, and a second wire connected to one of said segments at a second end of said row;
    wherein said first wire and said second wire draw electrical output from said panel to an electrical junction.

12. The solar panel according to claim 11, wherein abutting segments are similarly charged to form a parallel circuit.

13. The solar panel according to claim 11, wherein abutting segments are oppositely charged to form a series circuit.

14. A method of producing a thin film photovoltaic device, comprising:
    preparing an inert vacuum chamber for production of a roll of photovoltaic release material;
    depositing photovoltaic material onto a permanent substrate to form a photovoltaic web, said web having a positive edge and a negative edge;
    film masking two parallel, continuous bus bars, one to each said edge of said web, and film masking a plurality of fingers between said bus bars to form a thin film cell layer; and
    adhering to said thin film cell layer a contact transfer release sheet to form a roll of photovoltaic material with contact transfer release sheet.

15. The method of producing a thin film photovoltaic device according to claim 14, further comprising the step of segmenting said roll of photovoltaic release material along lines perpendicular to the longitudinal axis of said bus bars, and at intervals of at least every three said fingers, so as to produce elongated thin film cell stickers.

16. The method of producing a thin film photovoltaic device according to claim 15, further comprising the steps of:
    peeling from said thin film cell stickers an outer barrier layer of said contact transfer release sheet;
    applying side by side and sticky side down, a plurality of said thin film cell stickers onto a translucent, rigid medium such that adjacent said bus bar segments abut end to end;
    crimping an electrically conductive foil strip interconnect, together with lead wire, onto adjacent pairs of said bus bars to form a series or a parallel circuit.

17. The method according to claim 14, wherein said contact transfer release sheet comprises a clear adhesive, a release agent, and a barrier layer.

\* \* \* \* \*